(12) United States Patent
Xie et al.

(10) Patent No.: US 12,310,148 B2
(45) Date of Patent: May 20, 2025

(54) LIGHT-EMITTING DIODE AND DRIVING METHOD THEREFOR, AND LIGHT SOURCE APPARATUS AND ELECTRONIC DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Xiao Xie, Beijing (CN); Yang Liu, Beijing (CN); Huabin Chen, Beijing (CN); Xingliang Li, Beijing (CN); Yingqiang Gao, Beijing (CN); Linlin Wang, Beijing (CN); Ruirui Wang, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 479 days.

(21) Appl. No.: 17/762,654

(22) PCT Filed: May 17, 2021

(86) PCT No.: PCT/CN2021/094199
§ 371 (c)(1),
(2) Date: Mar. 22, 2022

(87) PCT Pub. No.: WO2021/238711
PCT Pub. Date: Dec. 2, 2021

(65) Prior Publication Data
US 2022/0344537 A1   Oct. 27, 2022

(30) Foreign Application Priority Data
May 27, 2020  (CN) .......................... 202010461152.7

(51) Int. Cl.
*H10H 20/814*  (2025.01)
*G09G 3/32*  (2016.01)
(Continued)

(52) U.S. Cl.
CPC ........... *H10H 20/8142* (2025.01); *G09G 3/32* (2013.01); *H10H 20/812* (2025.01); *H10H 20/814* (2025.01); *H10H 20/8312* (2025.01)

(58) Field of Classification Search
CPC ....... G09G 3/32; H01L 25/0756; H01L 33/10; H01L 33/105; H01L 33/06; H01L 33/382;
(Continued)

(56) References Cited

U.S. PATENT DOCUMENTS

| | | | | |
|---|---|---|---|---|
| 4,742,378 A | * | 5/1988 | Ito | .......................... H01S 5/185 257/95 |
| 6,064,683 A | * | 5/2000 | Johnson | .............. H01S 5/18308 372/46.015 |

(Continued)

FOREIGN PATENT DOCUMENTS

| | | |
|---|---|---|
| AU | 2002312952 A1 | 12/2002 |
| CN | 1176498 A | 3/1998 |

(Continued)

OTHER PUBLICATIONS

Baets, Roel G., et al., "Resonant-Cavity Light-Emitting Diodes: a review", Proceedings of SPIE, vol. 4996, pp. 74-86 (Year: 2003).*
(Continued)

*Primary Examiner* — Peter Bradford
*Assistant Examiner* — Ryan T. Fortin
(74) *Attorney, Agent, or Firm* — WHDA, LLP

(57) ABSTRACT

A light emitting diode including saturable absorber layer is provided. The light emitting diode includes: a substrate; a reflective light-emitting layer disposed on the substrate; a first electrode, a second electrode, and a first insulating layer
(Continued)

which are discretely disposed on the reflective light-emitting layer; a saturable absorber layer disposed on the first insulating layer; and a third electrode, a fourth electrode, and a reflective composite layer which are disposed on the saturable absorber layer, respectively, the reflectivity of the reflective light-emitting layer is greater than the reflectivity of the reflective composite layer; wherein the orthographic projections of the saturable absorber layer, the third electrode, the fourth electrode, and the reflective composite layer on the reflective light-emitting layer, respectively, do not overlap with the first electrode and the second electrode.

13 Claims, 7 Drawing Sheets

(51) Int. Cl.
*H10H 20/812* (2025.01)
*H10H 20/831* (2025.01)

(58) Field of Classification Search
CPC ......... H01L 33/38; H01L 33/46; H01L 33/04; H01L 33/0062; H01L 33/02; H01L 33/36; H01L 33/44; H10H 20/8142; H10H 20/812; H10H 20/814; H10H 20/8312
See application file for complete search history.

(56) References Cited

U.S. PATENT DOCUMENTS

| | | | |
|---|---|---|---|
| 6,067,309 | A | 5/2000 | Onomura et al. |
| 6,826,205 | B1 | 11/2004 | Myers et al. |
| 2003/0043484 | A1 | 3/2003 | Shen et al. |
| 2003/0152120 | A1 | 8/2003 | Ledentsov et al. |
| 2005/0040410 | A1* | 2/2005 | Ledentsov ............ H01S 5/0265 257/94 |
| 2005/0271092 | A1* | 12/2005 | Ledentsov .......... H01S 5/18302 372/20 |
| 2007/0291808 | A1* | 12/2007 | Ledentsov ............ H01S 5/0601 257/E27.12 |
| 2015/0349911 | A1* | 12/2015 | Otsubo ................ H04B 10/673 398/79 |
| 2016/0372581 | A1* | 12/2016 | Song ................... H01L 27/1288 |

FOREIGN PATENT DOCUMENTS

| | | | |
|---|---|---|---|
| CN | 1531769 | A | 9/2004 |
| CN | 1643752 | A | 7/2005 |
| CN | 106785885 | A | 5/2017 |
| CN | 108666860 | A | 10/2018 |
| CN | 109581750 | A | 4/2019 |
| CN | 111599899 | A | 8/2020 |
| JP | H03-236287 | A * | 10/1991 ........... H01L 33/105 |
| WO | WO 2008/029283 | A2 * | 3/2008 ........... H01L 33/105 |

OTHER PUBLICATIONS

Office Action dated Dec. 25, 2020, issued in counterpart CN Application No. 202010461152.7, with English Translation. (12 pages).

* cited by examiner

LIGHT-EMITTING DIODE AND DRIVING METHOD THEREFOR, AND LIGHT SOURCE APPARATUS AND ELECTRONIC DEVICE

CROSS REFERENCE TO RELEVANT APPLICATIONS

The present disclosure claims the priority of the Chinese patent application filed on May 27, 2020 before the Chinese Patent Office with the application number of 202010461152.7 and the title of "LIGHT EMITTING DIODE AND DRIVING METHOD THEREOF, LIGHT SOURCE APPARATUS, AND ELECTRONIC DEVICE", which is incorporated herein in its entirety by reference.

TECHNICAL FIELD

The present disclosure relates to the technical field of semiconductors, and more particularly to a light emitting diode and a driving method thereof, a light source apparatus, and an electronic device.

BACKGROUND

Light emitting diode (LED) is a commonly used light-emitting component, which releases energy and emits light by the recombination of electrons and holes. It is widely used in lighting, displaying, medical and other fields. Light emitting diode is capable to efficiently convert electrical energy into light energy and it has been widely used in modern society.

SUMMARY

The present disclosure provides a light emitting diode and a driving method thereof, a light source apparatus, and electronic device.

The present disclosure discloses a light emitting diode, comprising:
 a substrate;
 a reflective light-emitting layer disposed on the substrate;
 a first electrode, a second electrode, and a first insulating layer, wherein the first electrode, the second electrode, and the first insulating layer are disposed on the reflective light-emitting layer, respectively;
 a saturable absorber layer provided on the first insulating layer;
 and a third electrode, a fourth electrode, and a reflective composite layer, wherein the third electrode, the fourth electrode, and the reflective composite layer are disposed on the saturable absorber layer, respectively, and a reflectivity of the reflective light-emitting layer is greater than the reflectivity of the reflective composite layer;
 wherein the orthographic projections of the saturable absorber layer, the third electrode, the fourth electrode, and the reflective composite layer on the reflective light-emitting layer, respectively, do not overlap with the first electrode and the second electrode.

Optionally, the saturable absorber layer includes:
 a first P-type semiconductor layer, wherein the first P-type semiconductor layer is disposed on the first insulating layer, and the third electrode is disposed on the first P-type semiconductor layer;
 a first quantum well layer, wherein the first quantum well layer is disposed on the first P-type semiconductor layer, and the orthographic projection of the first quantum well layer on the first P-type semiconductor layer does not overlap with the third electrode; and
 a first N-type semiconductor layer, wherein the first N-type semiconductor layer is disposed on the first quantum well layer, the orthographic projection of the first N-type semiconductor layer on the first P-type semiconductor layer does not overlap with the third electrode, and the fourth electrode is disposed on the first N-type semiconductor layer.

Optionally, the reflective light-emitting layer includes:
 a P-type semiconductor reflective composite layer, wherein the P-type semiconductor reflective composite layer is disposed on the substrate, and the first electrode is disposed on the P-type semiconductor reflective composite layer;
 a second quantum well layer, wherein the second quantum well layer is disposed on the P-type semiconductor reflective composite layer, and the orthographic projection of the second quantum well layer on the P-type semiconductor reflective composite layer does not overlap with the first electrode; and
 a second N-type semiconductor layer, wherein the second N-type semiconductor layer is disposed on the second quantum well layer, the orthographic projection of the second N-type semiconductor layer on the P-type semiconductor reflective composite layer does not overlap with the first electrode, and the second electrode is disposed on the second N-type semiconductor layer.

Optionally, the P-type semiconductor reflective composite layer is provided with a mirror structure; or,
 the P-type semiconductor reflective composite layer includes a second P-type semiconductor layer and a first mirror layer disposed in stack, the first mirror layer is disposed close to the substrate.

Optionally, the light emitting diode further includes:
 an optical amplifier layer, wherein the optical amplifier layer is disposed on the reflective composite layer; and
 a fifth electrode and a sixth electrode, wherein the fifth electrode and the sixth electrode are disposed on the optical amplifier layer, respectively;
 wherein the orthographic projections of the optical amplifier layer, the fifth electrode, and the sixth electrode on the reflective light-emitting layer, respectively, do not overlap with the first electrode and the second electrode; the orthographic projections of the optical amplifier layer, the fifth electrode, and the sixth electrode on the saturable absorber layer, respectively, do not overlap with the third electrode and the fourth electrode.

Optionally, the optical amplifier layer includes:
 a third P-type semiconductor layer, wherein the P-type semiconductor layer is disposed on the reflective composite layer, and the fifth electrode is disposed on the third P-type semiconductor layer;
 a third quantum well layer, wherein the third quantum well layer is disposed on the third P-type semiconductor layer, the orthographic projection of the third quantum well layer on the third P-type semiconductor layer does not overlap with the fifth electrode; and
 a third N-type semiconductor layer disposed on the third quantum well layer, wherein the orthographic projection of the third N-type semiconductor layer on the third P-type semiconductor layer does not overlap with the fifth electrode, and the sixth electrode is disposed on the third N-type semiconductor layer.

Optionally, the fifth electrode and the sixth electrode are anode and cathode of the optical amplifier layer, respectively.

Optionally, the reflective composite layer is provided with a mirror structure and uses an insulating material; or, the reflective composite layer includes a second insulating layer and a second mirror layer disposed in stack.

Optionally, the first electrode and the second electrode are the anode and cathode of the reflective light-emitting layer, respectively, and the third electrode and the fourth electrode are the cathode and anode of the saturable absorber layer, respectively.

The present disclosure further discloses a driving method, the driving method is configured for driving the light emitting diode to implement the method as mentioned above, wherein the method includes:

inputting a first positive voltage to a first electrode, and a first negative voltage to a second electrode.

Optionally, the method further includes:

inputting a second negative voltage to a third electrode, and a second positive voltage to a fourth electrode.

Optionally, wherein the light emitting diode further includes an optical amplifier layer, a fifth electrode, and a sixth electrode, the method further includes:

inputting a third positive voltage to the fifth electrode, and a third negative voltage to the sixth electrode.

The present disclosure further discloses a computing-processing apparatus, including:

a memory in which a computer readable code is stored; and one or more processors, wherein when the computer readable code is executed by one or more processors, the computing-processing apparatus executes the driving method as mentioned above.

The present disclosure further discloses a computer program including a computer readable code, wherein the computer readable code, when executed on a computing-processing apparatus, causes the computing-processing apparatus to execute the driving method as mentioned above.

The present disclosure further discloses a computer-readable medium, wherein the computer-readable medium stores the computer program as mentioned above.

The present disclosure further discloses a light source apparatus, wherein the light source apparatus includes the light emitting diode as mentioned above.

The present disclosure further discloses an electronic device, wherein the electronic device includes the light source apparatus as mentioned above.

The above description is merely an overview of the technical solutions of the present disclosure, which may be implemented in accordance with the contents of the description in order to make the technical means of the present disclosure more clearly understood. In order to make the above and other objects, features, and advantages of the present disclosure more apparent and comprehensible, preferred embodiments of the present disclosure are set forth below.

BRIEF DESCRIPTION OF THE DRAWINGS

In order to illustrate the embodiments of the present disclosure or the technical solutions in the prior art more clearly, the following may briefly introduce the accompanying drawings needed to be used in the description of the embodiments or prior art; obviously, the drawings in the description below are some embodiments of the present disclosure, and for those of ordinary skills in the art, other drawings may also be obtained from these drawings without creative efforts.

DETAILED DESCRIPTION OF THE EMBODIMENTS

In order to make the above objects, features, and advantages of the present disclosure more obvious and understandable, the present disclosure may be described in further detail below with reference to the accompanying drawings and specific implementation modes. Obviously, the described embodiments are some, but not all, embodiments of the present disclosure. Based on the embodiments in the present disclosure, all other embodiments obtained by a person of ordinary skills in the art without inventive efforts fall within the scope of the present disclosure.

Figure 1:
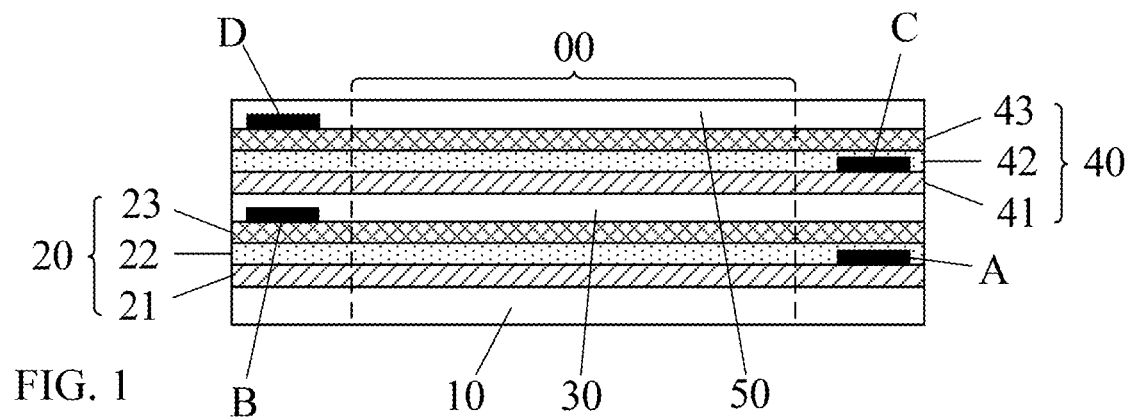
FIG. 1 shows a schematic cross-sectional view of a light emitting diode of an embodiment of the present disclosure.

FIG. 1 shows a schematic cross-sectional view of a light emitting diode of an embodiment of the present disclosure. Referring to FIG. 1, the light emitting diode includes:

a substrate 10;

a reflective light-emitting layer 20 disposed on the substrate 10;

a first electrode A, a second electrode B, and a first insulating layer 30, which are disposed on the reflective light-emitting layer 20, respectively;

a saturable absorber layer 40 disposed on the first insulating layer 30; and a third electrode C, a fourth electrode D, and a reflective composite layer 50, which are disposed on the saturable absorber layer 40, respectively, the reflectivity of the reflective light-emitting layer 20 is greater than the reflectivity of the reflective composite layer 50;

wherein the orthographic projections of the saturable absorber layer 40, the third electrode C, the fourth electrode D, and the reflective composite layer 50 on the reflective light-emitting layer 20, respectively, do not overlap with the first electrode A and the second electrode B.

In an embodiment of the present disclosure, the reflective light-emitting layer 20 is provided with the function of reflecting light and emitting light. The first electrode A and the second electrode B may be served as an anode and a cathode of the reflective light-emitting layer 20. The third electrode C and the fourth electrode D may be served as the cathode and anode of the saturable absorber layer 40. The reflective composite layer 50 is provided with the function of reflecting light. Since the first electrode A, the second electrode B, the third electrode C, and the fourth electrode D all need to be exposed at the uppermost layer for routing connection to receive a voltage signal for controlling a corresponding layer, it is necessary that the orthographic projections of the saturable absorber layer 40, the third electrode C, the fourth electrode D, and the reflective composite layer 50 on the reflective light-emitting layer 20, respectively, do not overlap with the first electrode A and the second electrode B so that neither the first electrode A nor the second electrode B is shielded by a superstructure.

As compared to related light emitting diode structures, the embodiment of the present disclosure adds a saturable absorber layer 40. A saturable absorber is a material with a nonlinear absorption property, and the optical absorption coefficient thereof is a function of light intensity. When the light intensity is small, the optical absorption coefficient is very large which is performed as substantially opaque. When the light intensity increases to a certain value, the optical absorption coefficient suddenly decreases and is performed as almost transparent. Therefore, the embodiment of the present disclosure adds one saturable absorber layer 40 to the related light emitting diode structure, that is, one saturable absorber is added on the upper layer of the light-emitting layer of the related light emitting diode structure.

Figure 2:
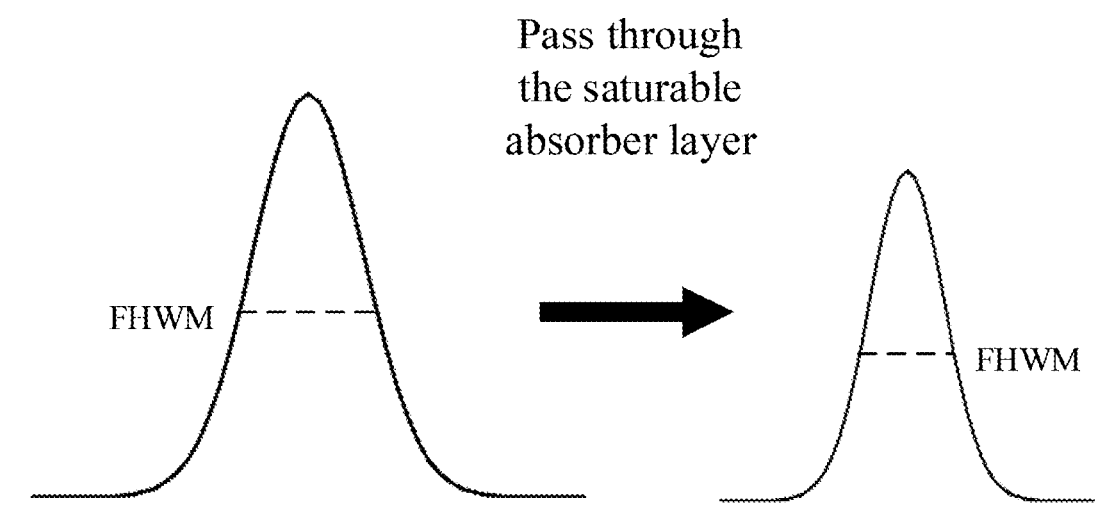
FIG. 2 shows a schematic view of spectral change before and after light emitted by a reflective light-emitting layer of an embodiment of the present disclosure passes through a saturable absorber layer.

FIG. 2 shows a schematic view of spectral change before and after light emitted by a reflective light-emitting layer of an embodiment of the present disclosure passes through a saturable absorber layer. Referring to FIG. 2, when light emitted by a reflective light-emitting layer 20 passes through a saturable absorber layer 40, light with low energy is absorbed more, and light with high energy is absorbed less. Therefore, the full width at half maximum (FHWM) of the light emitting diode spectrum decreases, thereby improving the color purity of the colored light of the light emitting diode.

In addition, since the saturable absorber is provided with a limited absorption capacity for light, two mirror structures may be disposed in a particular application. The saturable absorber may be disposed between the two mirror structures such that light emitted by the reflective light-emitting layer 20 may be reflected multiple times between the two mirror structures, thereby allowing light to be absorbed by passing through the saturable absorber multiple times. In the embodiment of the present disclosure, the reflective light-emitting layer 20 is provided with the function of reflecting light, and may be used as a mirror structure; the reflective composite layer 50 is also provided with the function of reflecting light, and may be used as another mirror structure. The saturable absorber layer 40 is located between the reflective light-emitting layer 20 and the reflective composite layer 50 such that the light emitted by the reflective light-emitting layer 20 may be absorbed multiple times. So that the function of the saturable absorber is fully exerted and that is beneficial for reducing the full width at half maximum of the light emitting diode spectrum.

Wherein, the reflectivity of the reflective light-emitting layer 20 is greater than that of the reflective composite layer 50 such that the light emitted by the reflective light-emitting layer 20 may exit from one side of the light emitting diode away from the substrate 10 after being absorbed and reflected multiple times by the saturable absorber layer 40 and the reflective composite layer 50.

In practical applications, the mirror structure may specifically be a distributed Bragg reflection (DBR) mirror structure. The DBR mirror structure is a periodic structure composed of two materials with different refractive indexes alternately disposed in an ABAB manner, wherein the optical thickness of each layer of the material is ¼ of the central reflection wavelength.

According to research findings, the quantum well material may present the characteristics of a saturable absorber when no voltage is applied or a reverse bias is applied. Therefore, the embodiment of the present disclosure may add one layer of a quantum well structure with no voltage applied or a reverse bias applied, that is, adding one saturable absorber, to a prior art light emitting diode structure.

Optionally, referring to FIG. 1, the saturable absorber layer 40 includes:

a first P-type semiconductor layer 41 disposed on the first insulating layer 30, wherein the third electrode C is disposed on the first P-type semiconductor layer 41;

a first quantum well layer 42 disposed on the first P-type semiconductor layer 41, wherein an orthographic projection of the first quantum well layer 42 on the first P-type semiconductor layer 41 does not overlap with the third electrode C;

and a first N-type semiconductor layer 43 disposed on the first quantum well layer 42, wherein the orthographic projection of the first N-type semiconductor layer 43 on the first P-type semiconductor layer 41 does not overlap with the third electrode C, and the fourth electrode D is disposed on the first N-type semiconductor layer 43.

The first insulating layer 30 plays an insulating role between the reflective light-emitting layer 20 and the saturable absorber layer 40. The third electrode C is connected to the first P-type semiconductor layer 41 to enable a control voltage input to the saturable absorber layer 40 through the first P-type semiconductor layer 41. The fourth electrode D is connected to the first N-type semiconductor layer 43 to enable a control voltage input to the saturable absorber layer 40 through the first N-type semiconductor layer 43. The orthographic projections of the first quantum well layer 42 and the first N-type semiconductor layer 43 on the first P-type semiconductor layer 41, respectively, do not overlap with the third electrode C such that the third electrode C is not shielded by a superstructure, and a routing connection is implemented.

In addition, since the quantum well structure may only present the characteristics of the saturable absorber when no voltage or a reverse bias is applied, in practical applications, no voltage or a reverse bias may be applied to the saturable absorber layer 40. Taking applying a reverse bias to the saturable absorber layer 40 as an example, a commonly used quantum well structure usually applies a positive voltage to the P-type semiconductor layer and a negative voltage to the N-type semiconductor layer; however, in the embodiment of the present disclosure, a negative voltage may be applied to the first P-type semiconductor layer 41 of the saturable absorber layer 40 and a positive voltage may be applied to the first N-type semiconductor layer 43, namely, a negative voltage is input to the third electrode C and a positive voltage is input to the fourth electrode D, thereby applying a reverse bias to the saturable absorber layer 40.

Optionally, referring to FIG. 1, the reflective light-emitting layer 20 includes:

a P-type semiconductor reflective composite layer 21 disposed on the substrate 10, wherein the first electrode A is disposed on the P-type semiconductor reflective composite layer 21;

a second quantum well layer 22 disposed on the P-type semiconductor reflective composite layer 21, wherein the orthographic projection of the second quantum well layer 22 on the P-type semiconductor reflective composite layer 21 does not overlap with the first electrode A;

and a second N-type semiconductor layer 23 disposed on the second quantum well layer 22, wherein the orthographic projection of the second N-type semiconductor layer 23 on the P-type semiconductor reflective composite layer 21 does not overlap with the first electrode A, and the second electrode B is disposed on the second N-type semiconductor layer 23.

The first electrode A is connected to the P-type semiconductor reflective composite layer 21 to implement a control voltage input to the reflective light-emitting layer 20 via the P-type semiconductor reflective composite layer 21. The second electrode B is connected to the second N-type semiconductor layer 23 to implement the control voltage input to the reflective light-emitting layer 20 via the second N-type semiconductor layer 23. The orthographic projections of the second quantum well layer 22 and the second N-type semiconductor layer 23 respectively on the P-type semiconductor reflective composite layer 21 do not overlap with the first electrode A such that the first electrode A is not shielded by the superstructure, and a routing connection is implemented.

Figure 3:
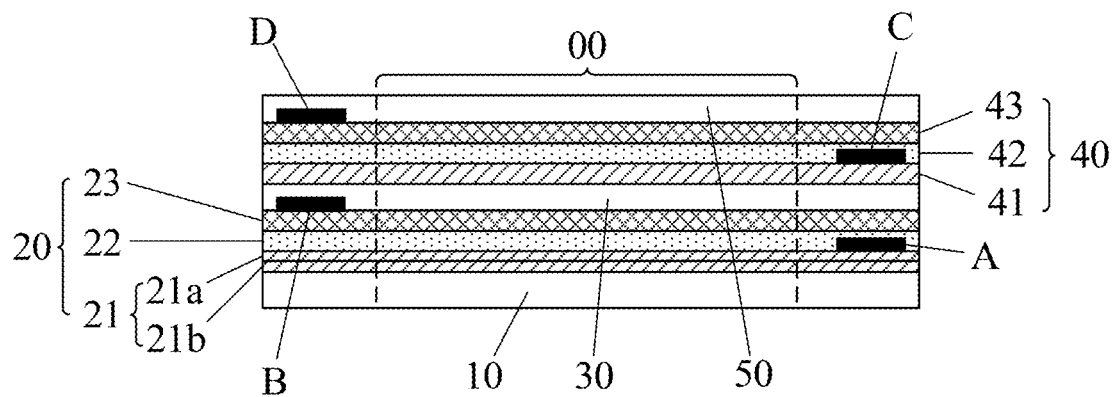
FIG. 3 shows a schematic cross-sectional view of another light emitting diode of an embodiment of the present disclosure.

Optionally, the P-type semiconductor reflective composite layer 21 is provided with a mirror structure; optionally, referring to FIG. 3, which shows a schematic cross-sectional view of another light emitting diode according to an embodiment of the present disclosure, the P-type semiconductor reflective composite layer 21 includes a second P-type semiconductor layer 21*a* and a first mirror layer 21*b* provided in stack, wherein the first mirror layer 21*b* is disposed close to the substrate 10. The first electrode A is disposed on the second P-type semiconductor layer 21*a* to be electrically connected to the second P-type semiconductor layer 21*a*. In practical applications, the first mirror layer 21*b* may in particular be a DBR mirror layer.

That is, in the embodiment of the present disclosure, the P-type semiconductor reflective composite layer 21 may be provided with both of the P-type semiconductor function and the mirror function at the same time, such that the thickness of the light emitting diode may be reduced. Certainly, the P-type semiconductor reflective composite layer 21 may also be a superposition of one layer of the mirror structure and one layer of the P-type semiconductor layer, which is not specifically limited by the embodiment of the present disclosure.

Figure 4:
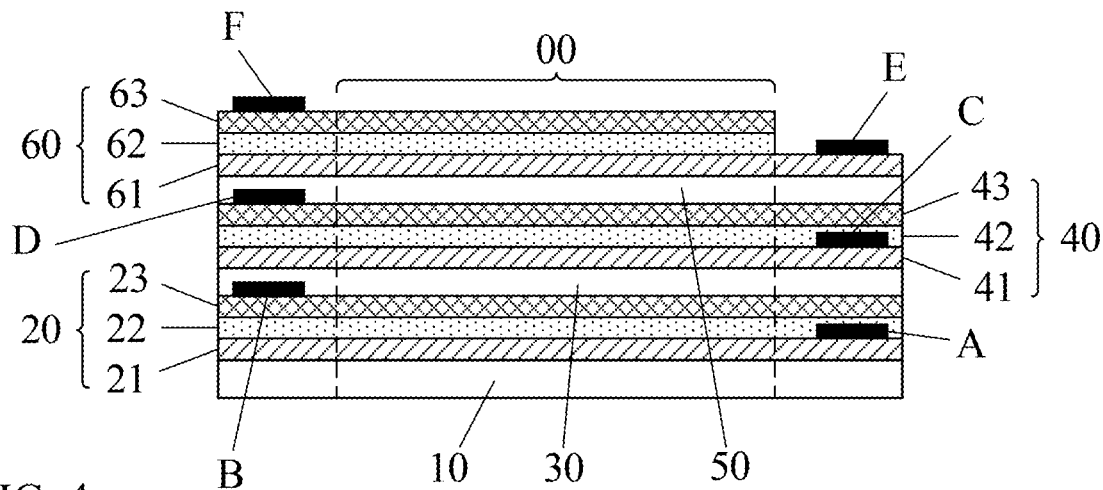
FIG. 4 shows a schematic cross-sectional view of yet another light emitting diode of an embodiment of the present disclosure.

In an embodiment of the present disclosure, optionally, referring to FIG. 4, there is shown a schematic cross-sectional view of yet another light emitting diode of an embodiment of the present disclosure. The light emitting diode may further include:

an optical amplifier layer 60 disposed on the reflective composite layer 50;

and a fifth electrode E and a sixth electrode F which are disposed on the optical amplifier layer 60, respectively;

wherein the orthographic projections of the optical amplifier layer 60, the fifth electrode E, and the sixth electrode F on the reflective light-emitting layer 20, respectively, do not overlap with the first electrode A and the second electrode B; the orthographic projections of the optical amplifier layer 60, the fifth electrode E, and the sixth electrode F respectively on the saturable absorber layer 40 do not overlap with the third electrode C and the fourth electrode D.

In the embodiment of the present disclosure, the optical amplifier layer 60 has the effect of amplifying the optical output power. The fifth electrode E and the sixth electrode F may be served as the anode and cathode of the optical amplifier layer 60.

Referring to FIG. 2, since after the light emitted by the reflective light-emitting layer 20 passes through the saturable absorber layer 40, the energy of the light may decrease, therefore, the optical output power of the light emitting diode is low. Therefore, in the embodiment of the present disclosure, one optical amplifier layer 60, that is, a semiconductor optical amplifier may be added on the upper layer of the saturable absorber layer 40 to increase the optical output power of the light emitting diode.

Optionally, referring to FIG. 4, the optical amplifier layer 60 includes:

a third P-type semiconductor layer 61 disposed on the reflective composite layer 50, wherein the fifth electrode E is disposed on the third P-type semiconductor layer 61;

a third quantum well layer 62 disposed on the third P-type semiconductor layer 61, wherein the orthographic projection of the third quantum well layer 62 on the third P-type semiconductor layer 61 does not overlap with the fifth electrode E;

and a third N-type semiconductor layer 63 disposed on the third quantum well layer 62, wherein the orthographic projection of the third N-type semiconductor layer 63 on the third P-type semiconductor layer 61 does not overlap with the fifth electrode E, and the sixth electrode F is disposed on the third N-type semiconductor layer 63.

The fifth electrode E is connected to the third P-type semiconductor layer 61 to implement control voltage input to the optical amplifier layer 60 via the third P-type semiconductor layer 61. The sixth electrode F is connected to the third N-type semiconductor layer 63 to implement control voltage input to the optical amplifier layer 60 via the third N-type semiconductor layer 63. The orthographic projections of the third quantum well layer 62 and the third N-type semiconductor layer 63 on the third P-type semiconductor layer 61, respectively, do not overlap with the fifth electrode E such that the fifth electrode E is not shielded by the superstructure, and a routing connection is implemented.

In addition, the orthographic projections of the saturable absorber layer 40, the third electrode C, the fourth electrode D, the reflective composite layer 50, the optical amplifier layer 60, the fifth electrode E, and the sixth electrode F respectively on the reflective light-emitting layer 20 do not overlap with the second electrode B. Therefore, the second electrode B is not shielded by the superstructure such that a routing connection may be implemented. The orthographic projections of the optical amplifier layer 60, the fifth electrode E, and the sixth electrode F respectively on the saturable absorber layer 40 do not overlap with the fourth electrode D. Therefore, the fourth electrode D is also not shielded by the superstructure, and a routing connection may be implemented. The sixth electrode F is provided at the uppermost layer of all the structures, and thus is not shielded and the routing connection may be implemented.

In the embodiment of the present disclosure, the structure of the semiconductor optical amplifier is also a quantum well structure, but the operating principles of the semiconductor optical amplifier and the quantum well light-emitting layer are different. The quantum well light-emitting layer uses the energy level transition to generate the population inversion, and then the high-energy particles transition to the low-energy level to implement the spontaneous radioluminescence. However, after population inversion occurs to the semiconductor optical amplifier, since after the light emitted from the reflective light-emitting layer 20 passes through the saturable absorber, the light may be irradiated into the semiconductor optical amplifier, the semiconductor optical amplifier may be subjected to stimulated radiation. The wavelength of the emitted light is the same as the wavelength of the incident light so that the spectrum may not be broadened.

In the light emitting diode disposed in the embodiment of the present disclosure, the first quantum well structure (P-type semiconductor+quantum well+N-type semiconductor in the reflective light-emitting layer 20) close to the substrate 10 may be served as a light-emitting layer, the second quantum well structure above (P-type semiconductor+quantum well+N-type semiconductor in the saturable absorber layer 40) may be served as a saturable absorber, and the third quantum well structure further above (P-type semiconductor+quantum well+N-type semiconductor in the optical amplifier layer 60) may be served as a semiconductor optical amplifier. When the light emitting diode is operating, a forward bias may be applied to the first quantum well structure and the third quantum well structure, and a negative bias or no voltage may be applied to the second quantum well structure so that the light emitting diode may be driven.

Figure 5:
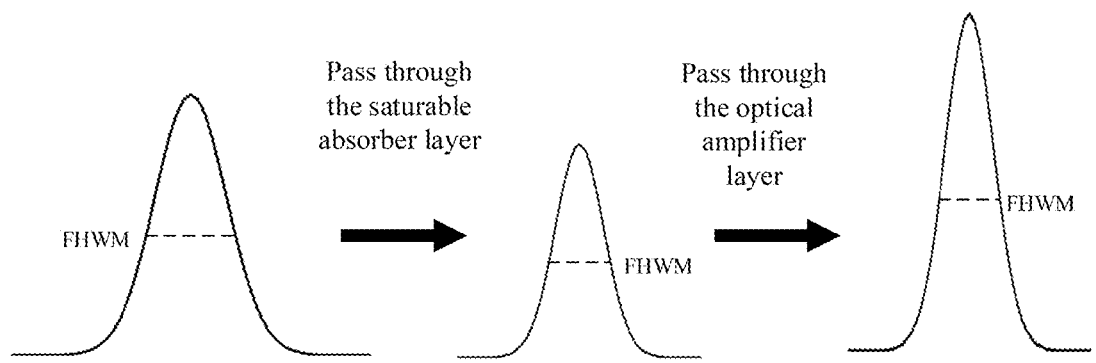
FIG. 5 shows a schematic view of the spectral change before and after light emitted by a reflective light-emitting layer of an embodiment of the present disclosure sequentially passes through a saturable absorber layer and an optical amplifier layer.

FIG. 5 shows a schematic view of the spectral change before and after light emitted by a reflective light-emitting layer of an embodiment of the present disclosure sequentially passes through a saturable absorber layer and an optical amplifier layer. Referring to FIG. 5, after the light emitted from the saturable absorber layer passes through the optical amplifier layer, the full width at half maximum FHWM of the spectrum is basically unchanged, but the output light energy increases (the amount of the light energy may be performed by the spectral height), that is, the optical output power of the light emitting diode increases.

Figure 6:
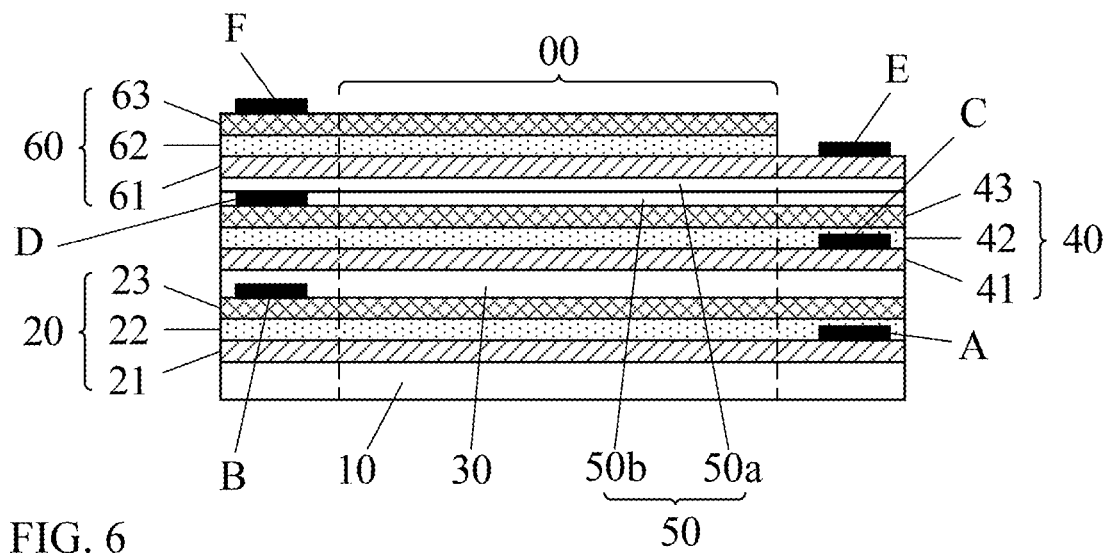
FIG. 6 shows a schematic cross-sectional view of yet another light emitting diode of an embodiment of the present disclosure.

Further, in the case where the light emitting diode does not include the optical amplifier layer 60, it works if the reflective composite layer 50 is provided with a mirror structure. However, in the case where the light emitting diode includes the optical amplifier layer 60, the reflective composite layer 50 also needs to be insulated from the optical amplifier layer 60. Therefore, in the embodiment of the present disclosure, in the case where the light emitting diode includes the optical amplifier layer 60, optionally, the reflective composite layer 50 is provided with a mirror structure and uses the insulating material; optionally, referring to FIG. 6, there is shown a schematic cross-sectional view of yet another light emitting diode of an embodiment of the present disclosure, the reflective composite layer 50 including a second insulating layer 50a and a second mirror layer 50b disposed in stack. The second insulating layer 50a or the second mirror layer 50b may be disposed close to the substrate 10, which may not be specifically defined in the embodiment of the present disclosure. In practical applications, the second mirror layer 50b may specifically be a DBR mirror layer.

Further, a method for manufacturing a light emitting diode provided by an embodiment of the present disclosure mainly differs from the method for manufacturing a related light emitting diode in terms of the growth of an epitaxial wafer and the preparation of an electrode. Other technological processes, such as epitaxial wafer cleaning, epitaxial wafer front-side protection, substrate thinning, the preparation of an isolation channel, the filling of an isolation channel, the fixing of a lower surface of a chip, etc. may be referred to the prior art. In the following, taking the light emitting diode structure shown in FIG. 1 as an example, the technological processes of epitaxial wafer growth and electrode preparation are mainly introduced as following:

1) Cleaning an epitaxial wafer: the epitaxial wafer may be cleaned sequentially by deionized water, ethanol, acetone, ethanol, and deionized water, then the epitaxial wafer is soaked by concentrated sulfuric acid ($H_2SO_4$) to remove the oxide on the surface of the epitaxial wafer. The epitaxial wafer may be selected from intrinsic semiconductor materials such as AlGaInP and the like. Taking the AlGaInP epitaxial wafer as an example, the structures or film layers in the light emitting diode except the electrode may all be AlGaInP-based structures or film layers. For example, the substrate may be an AlGaInP layer, each P-type semiconductor layer in the light emitting diode may be a boron-doping AlGaInP layer, and each N-type semiconductor layer in the light emitting diode may be a phosphorus-doping AlGaInP layer.

Figure 7:
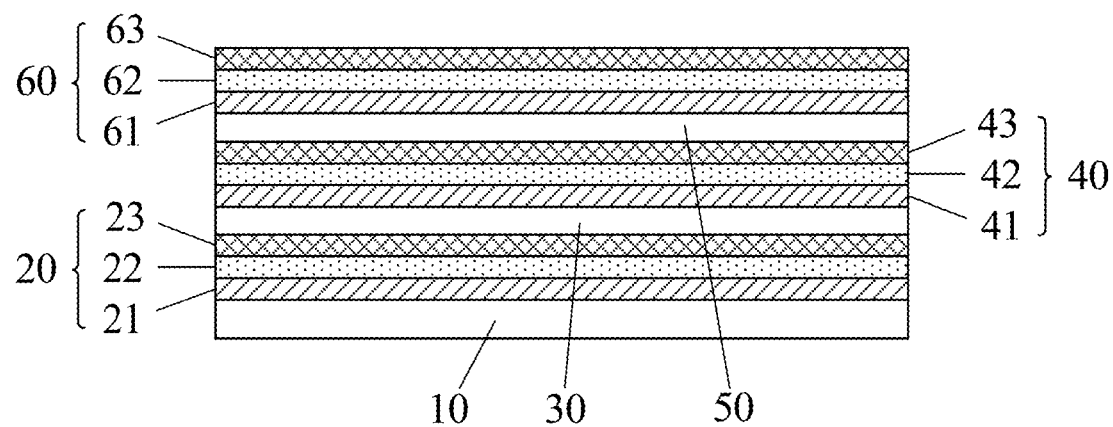
FIG. 7 shows a top view of an epitaxial wafer grown with three quantum well structures according to an embodiment of the present disclosure.

2) Epitaxial wafer growth: the growth of the epitaxial wafer may be performed by an MOCVD (Metal-organic Chemical Vapor Deposition) method. Unlike the structure of the conventional light emitting diode, the embodiment of the present disclosure requires the growth of three quantum well structures as a light-emitting layer, a saturable absorber, and an optical amplifier, respectively, and an intrinsic semiconductor material layer may be grown between each quantum well structure for insulation, as shown in FIG. 7.

Figure 8:
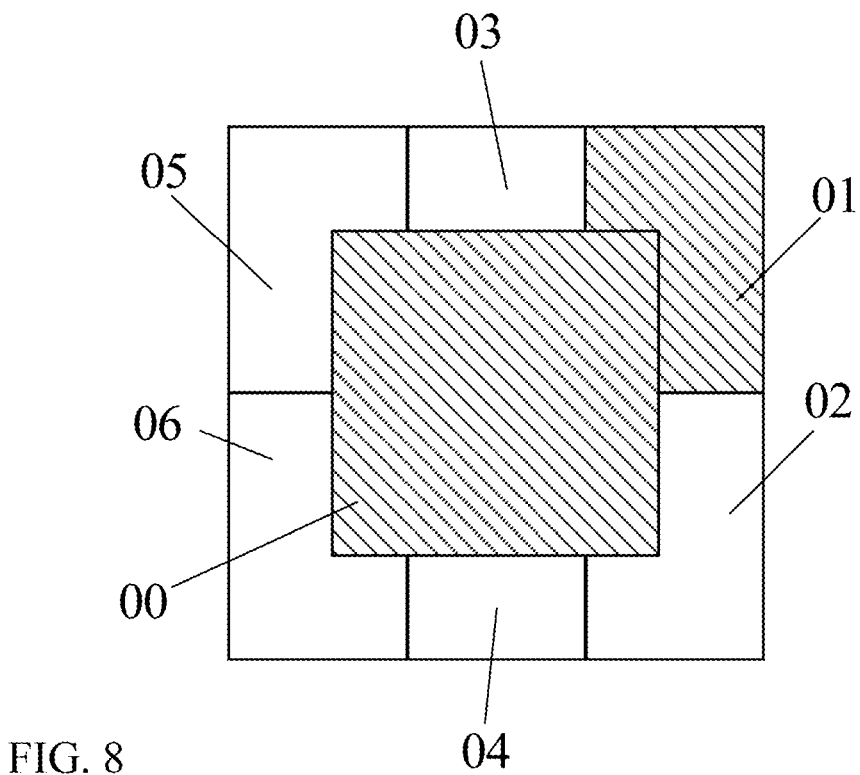
FIG. 8 shows a schematic view of a photoresist overlay area 01 and a light-emitting area 00 of an embodiment of the present disclosure.

3) Forming a setting area of the fifth electrode E: referring to FIG. 8, an area 01 for setting the sixth electrode F, and a light-emitting area 00 are covered with a photoresist, and then the respective upper structures of the third P-type semiconductor layer 61 in area 02, the area 03, the area 04, the area 05, and the area 06 may be dry-etched by using ICP (inductively coupled plasma). Any one of area 02, area 03, area 04, area 05, and area 06 obtained after this etching may be used as the setting area for the fifth electrode E.

Figure 9:
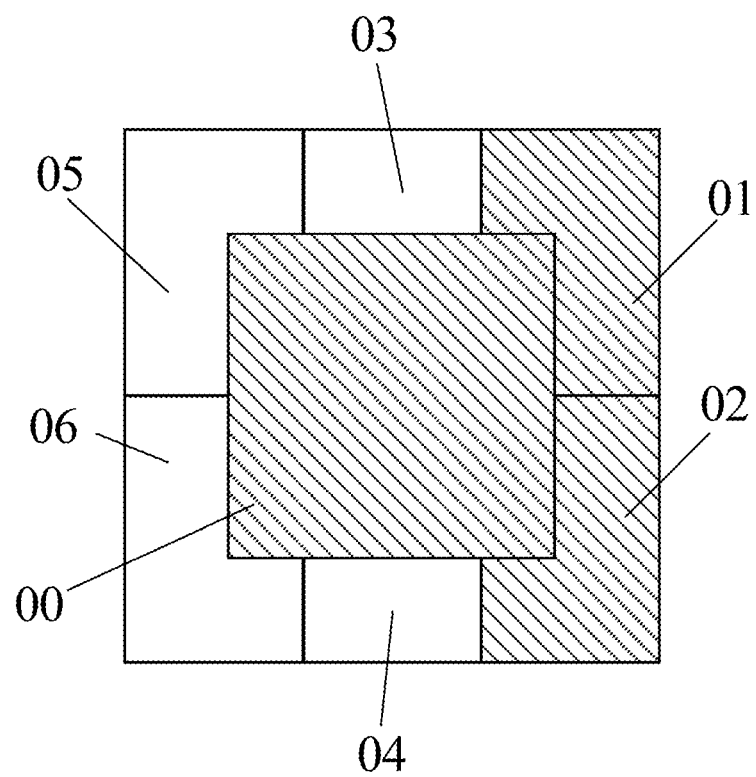
FIG. 9 shows a schematic view of a photoresist overlay area 01, an area 02, and a light-emitting area 00 of an embodiment of the present disclosure.

4) Forming the setting area of the fourth electrode D: taking the area 02 as the setting area of the fifth electrode E as an example, referring to FIG. 9, the area 01 for setting the sixth electrode F, the area 02 for the fifth electrode E, and the light-emitting area 00 are covered with photoresist, and then the respective upper structures of the first N-type semiconductor layer 43 in area 03, the area 04, the area 05, and the area 06 may be dry-etched by using ICP. Any one of area 03, area 04, area 05, and area 06 obtained after this etching may be used as the setting area of the fourth electrode D.

Figure 10:
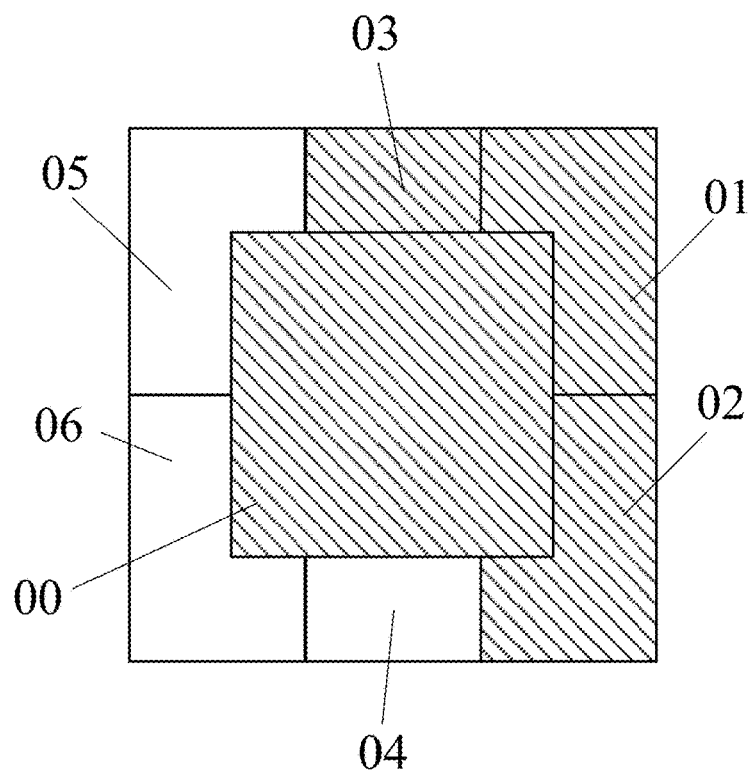
FIG. 10 shows a schematic view of a photoresist overlay area 01, an area 02, an area 03, and a light-emitting area 00 of an embodiment of the present disclosure.

5) Forming the setting area of the third electrode C: taking the area 03 as the setting area of the fourth electrode D as an example, referring to FIG. 10, the area 01 for setting the sixth electrode F, the area 02 for the fifth electrode E, the area 03 for the fourth electrode D, and the light-emitting area 00 are covered with photoresist, and then the respective upper structures of the first P-type semiconductor layer 41 in area 04, the area 05, and the area 06 may be dry-etched by using ICP. Any one of area 04, area 05, and area 06 obtained after this etching may be used as the setting area for the third electrode C.

Figure 11:
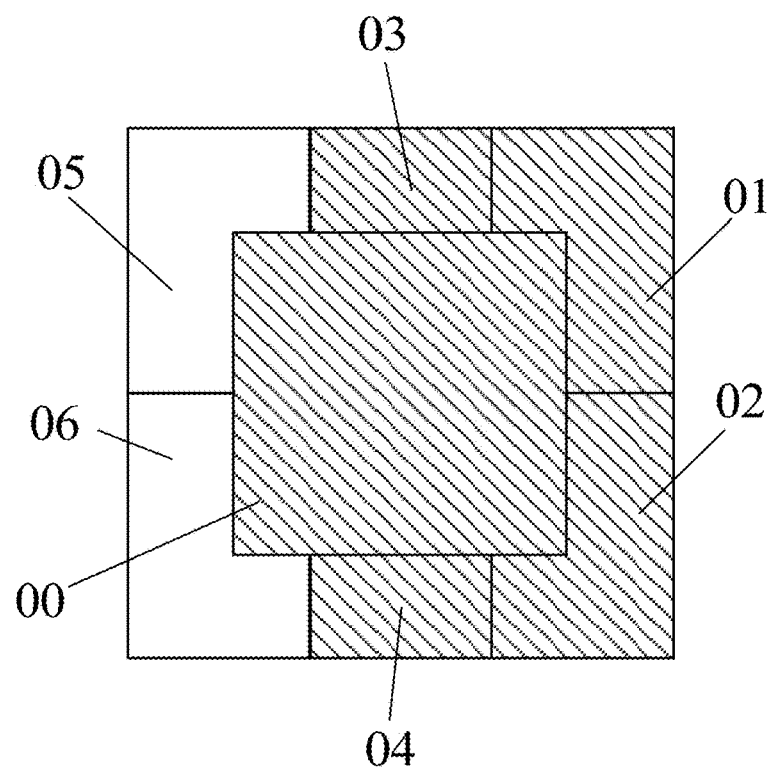
FIG. 11 shows a schematic view of a photoresist overlay area 01, an area 02, an area 03, an area 04, and a light-emitting area 00 of an embodiment of the present disclosure.

6) Forming the setting area of the second electrode B: taking the area 04 as the setting area of the third electrode C as an example, referring to FIG. 11, the area 01 for setting the sixth electrode F, the area 02 for the fifth electrode E, the area 03 for the fourth electrode D, the area 04 for the third electrode C, and the light-emitting area 00 are covered with photoresist, and then the respective upper structures of the second N-type semiconductor layer 23 in area 05 and the area 06 may be dry-etched by using ICP. Any one of area 05 and area 06 obtained after this etching may be used as the setting area of the second electrode B.

Figure 12:
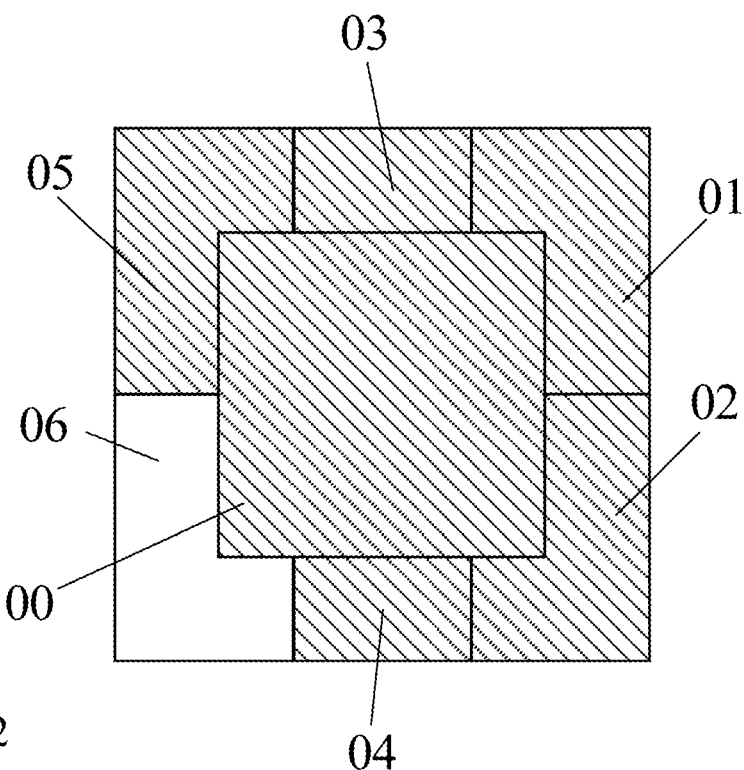
FIG. 12 shows a schematic view of a photoresist overlay area 01, an area 02, an area 03, an area 04, an area 05, and a light-emitting area 00 of an embodiment of the present disclosure.

7) Forming the setting area of the first electrode A: taking the area 05 as the setting area of the second electrode B as an example, referring to FIG. 12, the area 01 for setting the sixth electrode F, the area 02 for the fifth electrode E, the area 03 for the fourth electrode D, the area 04 for the third electrode C, the area 05 for the second electrode B, and the light-emitting area 00 are covered with a photoresist, and then each upper structure of the P-type semiconductor reflective composite layer 21 in the area 06 may be dry-etched by using ICP. The area 06 obtained after this etching may be used as the setting area of the first electrode A.

Figure 13:
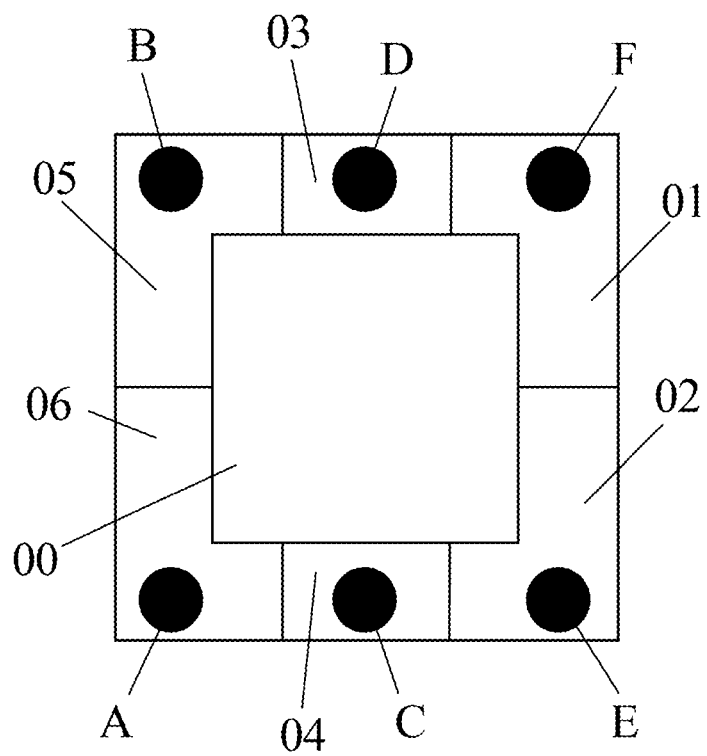
FIG. 13 shows a top view of a light emitting diode after an electrode is disposed according to an embodiment of the present disclosure.

8) Manufacturing the electrode: the first electrode A may be fabricated in area 06, the second electrode B may be fabricated in area 05, the third electrode C may be fabricated in area 04, the fourth electrode D may be fabricated in area 03, the fifth electrode E may be fabricated in area 02, and the sixth electrode F may be fabricated in area 01 by using the techniques such as lift-off+evaporation, or evaporation+photolithography, as shown in FIG. 13.

Certainly, the method for manufacturing the light emitting diode provided by the embodiment of the present disclosure may further comprise other conventional technological processes, and the embodiment of the present disclosure may not be described in detail herein.

In addition, the division mode of area 01, area 02, area 03, area 04, area 05, and area 06 in the above figures is only an example, and does not limit the present disclosure. In practical applications, it is only required that the first electrode A, the second electrode B, the third electrode C, the fourth electrode D, the fifth electrode E, and the sixth electrode F expose the uppermost layer provided that it may implement a routing connection, which may not be specifically defined by the embodiment of the present disclosure.

In an embodiment of the present disclosure, a light emitting diode includes a substrate, a reflective light-emitting layer disposed on the substrate, a first electrode, a second electrode, and a first insulating layer disposed on the reflective light-emitting layer, respectively, a saturable absorber layer provided on the first insulating layer, and a third electrode, a fourth electrode, and a reflective composite layer disposed on the saturable absorber layer, respectively, The reflectivity of the reflective light-emitting layer is greater than the reflectivity of the reflective composite layer to ensure that light exits from one side away from the substrate. In addition, the orthographic projections of the saturable absorber layer, the third electrode, the fourth electrode, and the reflective composite layer on the reflective light-emitting layer, respectively, do not overlap with the first electrode and the second electrode such that the first electrode, the second electrode, the third electrode, and the fourth electrode are not shielded by the superstructure, and the routing connection may be implemented. In an embodiment of the present disclosure, by adding the saturable absorber layer, after the light emitted from the reflective light-emitting layer passes through the saturable absorber layer, the light with low energy is absorbed more, and the light with high energy is absorbed less, thereby reducing the full width at half maximum of the light emitting diode spectrum, and thereby improving the color purity of the colored light of the light emitting diode.

An embodiment of the present disclosure also discloses a driving method that may be configured for driving the above-mentioned light emitting diode. The driving method includes:

inputting a first positive voltage to the first electrode A, and a first negative voltage to the second electrode B.

The first electrode A may be served as the anode for controlling the reflective light-emitting layer 20 and the second electrode B may be served as the cathode for controlling the reflective light-emitting layer 20, that is to say, in the embodiment of the present disclosure, a forward bias may be input to the reflective light-emitting layer 20 to drive the reflective light-emitting layer 20 to emit light.

Optionally, the method further includes:

inputting a second negative voltage to the third electrode C, and a second positive voltage to the fourth electrode D.

The third electrode C may be served as the cathode for controlling the saturable absorber layer 40, and the fourth electrode D may be served as the anode for controlling the saturable absorber layer 40, that is, in the embodiment of the present disclosure, a reverse bias may be input to the saturable absorber layer 40, thereby driving the saturable absorber layer 40.

In addition, in practical applications, optionally, it is also possible that no voltage is input to the third electrode C and the fourth electrode D, that is to say, it is possible that no voltage is applied to the saturable absorber layer 40, and the saturable absorber layer 40 may achieve the function of a saturable absorber without being applied a voltage and with the application of a reverse bias, and the embodiment of the present disclosure does not specifically define this. The application of a reverse bias makes the saturable absorbent capacity of the saturable absorber layer 40 better.

Optionally, the light emitting diode further comprises an optical amplifier layer 60, a fifth electrode E, and a sixth electrode F, the method further comprising:

inputting a third positive voltage to the fifth electrode E, and a third negative voltage to the sixth electrode F.

The fifth electrode E may be served as the anode of the optical amplifier layer 60, and the sixth electrode F may be served as the cathode of the optical amplifier layer 60, namely, in the embodiment of the present disclosure, a forward bias may be input to the optical amplifier layer 60 to drive the optical amplifier layer 60 to perform optical power amplification.

In an embodiment of the present disclosure, a first positive voltage may be input to the first electrode of a light emitting diode, a first negative voltage may be input to the second electrode, a second negative voltage may be input to the third electrode, a second positive voltage may be input to the fourth electrode, a third positive voltage may be input to the fifth electrode, and a third negative voltage may be input to the sixth electrode, that is to say, a forward bias is applied to a reflective light-emitting layer, a reverse bias is applied to a saturable absorber layer, and a forward bias is applied to an optical amplifier layer so that it is possible to improve the color purity of the colored light of the light emitting diode and to improve the optical output power of the light emitting diode while driving the light emitting diode to emit light.

An embodiment of the present disclosure also discloses a light source apparatus including the light emitting diode described above.

In the display field, a light source apparatus may specifically be a backlight module, and the embodiment of the present disclosure does not specifically define the light source apparatus.

In an embodiment of the present disclosure, a light emitting diode in a light source apparatus comprises a substrate, a reflective light-emitting layer disposed on the substrate, a first electrode, a second electrode, and a first insulating layer disposed on the reflective light-emitting layer, respectively, a saturable absorber layer provided on the first insulating layer, and a third electrode, a fourth electrode, and a reflective composite layer disposed on the saturable absorber layer, respectively. The reflectivity of the reflective light-emitting layer is greater than the reflectivity of the reflective composite layer to ensure that light exits from one side away from the substrate. In addition, the orthographic projections of the saturable absorber layer, the third electrode, the fourth electrode, and the reflective composite layer on the reflective light-emitting layer, respectively, do not overlap with the first electrode and the second electrode such that the first electrode, the second electrode, the third electrode, and the fourth electrode are not shielded by the superstructure, and the routing connection may be implemented. In an embodiment of the present disclosure, by adding the saturable absorber layer, after the light emitted from the reflective light-emitting layer passes through the saturable absorber layer, the light with low energy is absorbed more, and the light with high energy is absorbed less, thereby reducing the full width at half maximum of the light emitting diode spectrum, and thereby improving the color purity of the colored light of the light emitting diode.

An embodiment of the present disclosure also discloses electronic device including the light source apparatus described above.

In the display field, the electronic device may specifically be display equipment, and the electronic device may not be specifically defined by embodiments of the present disclosure.

In an embodiment of the present disclosure, a light emitting diode in the electronic device includes a substrate, a reflective light-emitting layer disposed on the substrate, a first electrode, a second electrode, and a first insulating layer disposed on the reflective light-emitting layer, respectively, a saturable absorber layer disposed on the first insulating layer, and a third electrode, a fourth electrode, and a reflective composite layer disposed on the saturable absorber layer, respectively. The reflectivity of the reflective light-emitting layer is greater than the reflectivity of the reflective composite layer to ensure that light exits from one side away from the substrate. In addition, the orthographic projections of the saturable absorber layer, the third electrode, the fourth electrode, and the reflective composite layer on the reflective light-emitting layer, respectively, do not overlap with the first electrode and the second electrode such that the first electrode, the second electrode, the third electrode, and the fourth electrode are not shielded by the superstructure, and the routing connection may be implemented. In an embodiment of the present disclosure, by adding the saturable absorber layer, after the light emitted from the reflective light-emitting layer passes through the saturable absorber layer, the light with low energy is absorbed more, and the light with high energy is absorbed less, thereby reducing the full width at half maximum of the light emitting diode spectrum, and thereby improving the color purity of the colored light of the light emitting diode.

For the foregoing method embodiments, for the sake of simple description, they are all expressed as a series of action combinations. But those skilled in the art should know that the present disclosure is not limited by the described action sequence. Because according to the present disclosure, certain steps may be performed in other orders or simultaneously. Secondly, those skilled in the art should also know that the embodiments described in the description are all preferred embodiments, and the actions and modules involved are not necessarily essential to the present disclosure.

The device embodiments described above are merely schematic. The units described as separate components may or may not be physically separated, and components displayed as units may or may not be physical units, that is, may be located in one place, or may be distributed to multiple network units. Some or all of the modules may be selected to achieve the object of the embodiment solution according to actual requirements. A person of ordinary skills in the art would have been able to understand and implement the same without involving inventive efforts.

Various component embodiments of the present disclosure may be implemented in hardware, or in a software module running on one or more processors, or in a combination thereof. Those skilled in the art should understand that a microprocessor or a digital signal processor (DSP) may be used in practice to implement some or all of the functions of some or all of the components in computing processing equipment according to embodiments of the present disclosure. The present disclosure may also be implemented as some or all equipment or device programs (eg, computer programs and computer program products) for executing the method described herein. Such a program implementing the present disclosure may be stored on a computer-readable medium or may have the form of one or more signals. Such signals may be downloaded from an Internet website, provided on a carrier signal, or provided in any other form.

Figure 14:
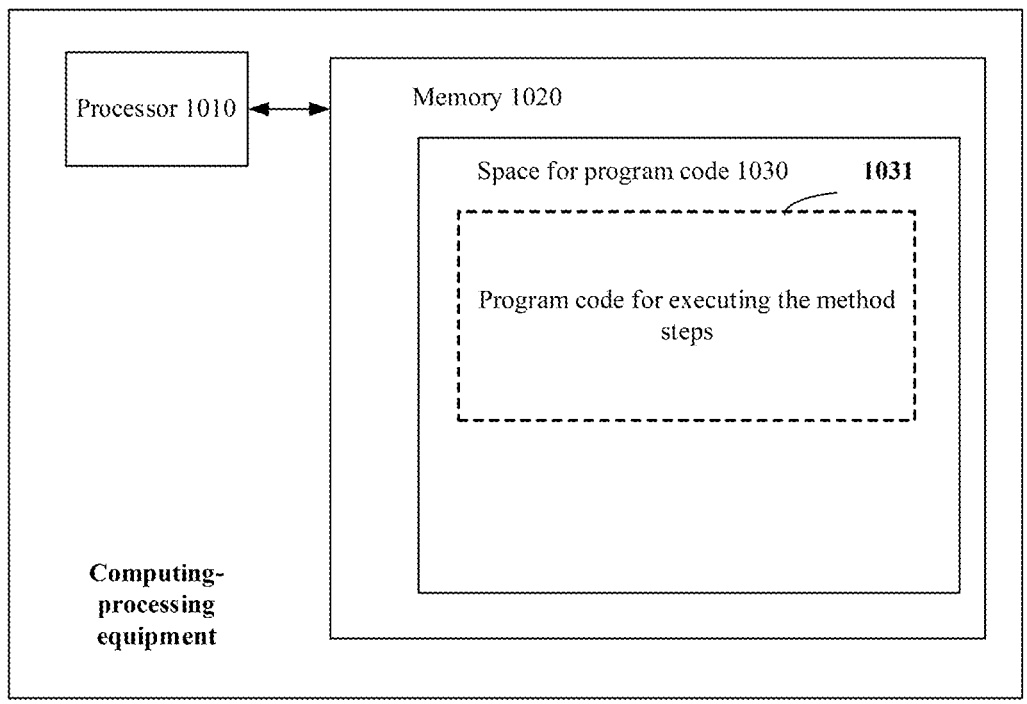
FIG. 14 schematically shows a block diagram of computing-processing apparatus for executing a method according to the present disclosure.
Figure 15:
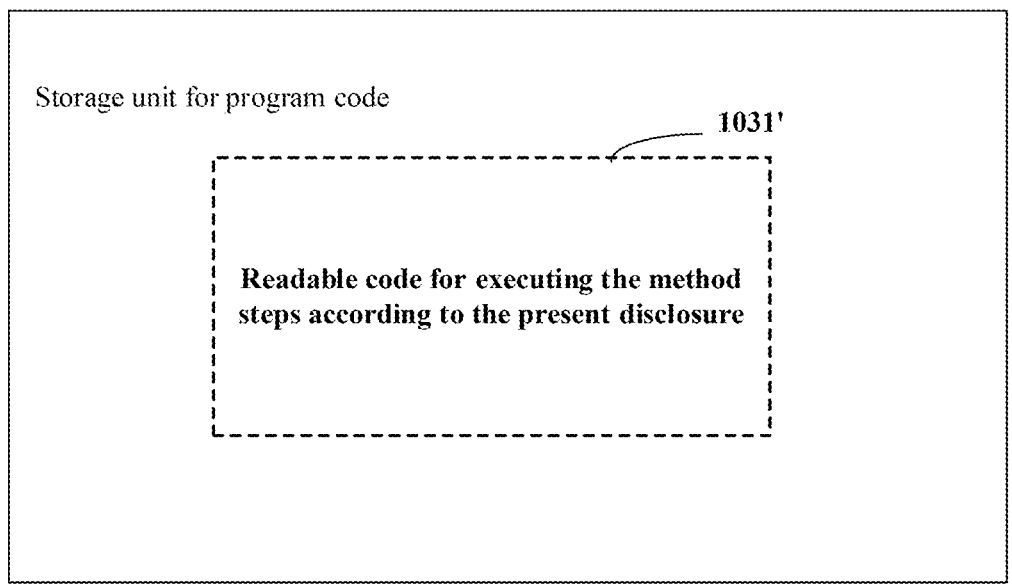
FIG. 15 schematically shows a storage unit for holding or carrying a program code implementing a method according to the present disclosure.

For example, FIG. 14 shows computing-processing apparatus that may implement the method according to the present disclosure. The computing-processing apparatus conventionally includes a processor 1010, and a computer program product or computer readable medium in the form of a memory 1020. Memory 1020 may be electronic memory such as flash memory, EEPROM (Electrically Erasable Programmable Read Only Memory), EPROM, hard disk, or ROM. Memory 1020 has a storage space 1030 for program code 1031 for executing any of the method steps in the method described above. For example, the storage space 1030 for program code may include respective program code 1031 for implementing various steps in the above method respectively. These program codes may be read from or written to one or more computer program products. These computer program products include a program code carrier such as a hard disk, a compact disc (CD), a memory card, or a floppy disk. Such a computer program product is typically a portable or fixed storage unit as described with reference to FIG. 15. The storage unit may have a memory segment, storage space, etc. disposed similarly to the memory 1020 in the computing-processing apparatus of FIG. 14. The program code may, for example, be compressed in a suitable form. Generally, the storage unit includes a computer readable code 1031', i.e. a code that may be read by a processor, such as, for example, 1010. When run by the computing-processing apparatus, these codes cause the computing-processing apparatus to execute various steps in the method described above.

Each embodiment in the present description is illustrated in a progressive manner, with each embodiment focusing on differences from the other embodiments and like parts between each embodiment referring to each other.

Finally, it also needs to be noted that relational terms such as first and second, and the like, used herein are only intended to distinguish one entity or operation from another entity or operation, and do not necessarily require or imply that any such actual relationship or sequence exists between these entities or operations. Furthermore, the terms "comprise", "include", or any other variation thereof, are intended to cover a non-exclusive inclusion, such that a process, method, article, or equipment that comprises a list of elements not only includes those elements but also includes other elements not expressly listed, or further includes elements inherent to such a process, method, article, or equipment. In a case without further limitations, an element defined by the phrase "comprising one . . . " does not preclude the presence of additional identical elements in the process, method, article, or equipment that includes the element.

A light emitting diode, a driving method thereof, a light source apparatus, and an electronic device provided by the present disclosure are described in detail above. While specific examples have been employed herein to illustrate the principles and implementation modes of the present disclosure, the foregoing illustrations of the embodiments have been presented only to aid in the understanding of the method and core concept of the present disclosure; at the same time, for those of ordinary skills in the art, according to the concept of the present disclosure, there may be changes in the preferred embodiments and application scope. In summary, the content of the present description should not be construed as a limitation of the present disclosure.

The invention claimed is:

1. A light emitting diode, comprising:
   a substrate;
   a reflective light-emitting layer disposed on the substrate;
   a first electrode, a second electrode, and a first insulating layer, wherein the first electrode, the second electrode, and the first insulating layer are separately disposed on the reflective light-emitting layer;
   a saturable absorber layer, wherein the saturable absorber layer is disposed on the first insulating layer; and
   a third electrode, a fourth electrode, and a reflective composite layer, wherein the third electrode, the fourth electrode, and the reflective composite layer are separately disposed on the saturable absorber layer, and a reflectivity of the reflective light-emitting layer is greater than the reflectivity of the reflective composite layer;
   wherein the orthographic projections of the saturable absorber layer, the third electrode, the fourth electrode, and the reflective composite layer on the reflective light-emitting layer do not overlap with the first electrode and the second electrode,
   wherein the light emitting diode further comprises:
   an optical amplifier layer, wherein the optical amplifier layer is disposed on the reflective composite layer; and
   a fifth electrode and a sixth electrode, wherein the fifth electrode and the sixth electrode are disposed on the optical amplifier layer separately;
   wherein the orthographic projections of the optical amplifier layer, the fifth electrode, and the sixth electrode on the reflective light-emitting layer do not overlap with the first electrode and the second electrode; the orthographic projections of the optical amplifier layer, the fifth electrode, and the sixth electrode on the saturable absorber layer do not overlap with the third electrode and the fourth electrode.

2. The light emitting diode according to claim 1, wherein the saturable absorber layer comprises:
   a first P-type semiconductor layer, wherein the first P-type semiconductor layer is disposed on the first insulating layer, and the third electrode is disposed on the first P-type semiconductor layer;
   a first quantum well layer, wherein the first quantum well layer is disposed on the first P-type semiconductor layer, and the orthographic projection of the first quantum well layer on the first P-type semiconductor layer does not overlap with the third electrode; and
   a first N-type semiconductor layer, wherein the first N-type semiconductor layer is disposed on the first quantum well layer, the orthographic projection of the first N-type semiconductor layer on the first P-type semiconductor layer does not overlap with the third electrode, and the fourth electrode is disposed on the first N-type semiconductor layer.

3. The light emitting diode according to claim 1, wherein the reflective light-emitting layer comprises:
   a P-type semiconductor reflective composite layer, wherein the P-type semiconductor reflective composite layer is disposed on the substrate, and the first electrode is disposed on the P-type semiconductor reflective composite layer;
   a second quantum well layer, wherein the second quantum well layer is disposed on the P-type semiconductor reflective composite layer, and the orthographic projection of the second quantum well layer on the P-type semiconductor reflective composite layer does not overlap with the first electrode; and a second N-type semiconductor layer, wherein the second N-type semiconductor layer is disposed on the second quantum well layer, the orthographic projection of the second N-type semiconductor layer on the P-type semiconductor reflective composite layer does not overlap with the first electrode, and the second electrode is disposed on the second N-type semiconductor layer.

4. The light emitting diode according to claim 3, wherein the P-type semiconductor reflective composite layer is provided with a mirror structure; or, the P-type semiconductor reflective composite layer comprises a second P-type semiconductor layer and a first mirror layer disposed in stack, the first mirror layer is disposed close to the substrate.

5. The light emitting diode according to claim 1, wherein the optical amplifier layer comprises:

a third P-type semiconductor layer, wherein the P-type semiconductor layer is disposed on the reflective composite layer, and the fifth electrode is disposed on the third P-type semiconductor layer;

a third quantum well layer, wherein the third quantum well layer is disposed on the third P-type semiconductor layer, the orthographic projection of the third quantum well layer on the third P-type semiconductor layer does not overlap with the fifth electrode; and a third N-type semiconductor layer disposed on the third quantum well layer, wherein the orthographic projection of the third N-type semiconductor layer on the third P-type semiconductor layer does not overlap with the fifth electrode, and the sixth electrode is disposed on the third N-type semiconductor layer.

6. The light emitting diode according to claim 1, wherein the fifth electrode and the sixth electrode are anode and cathode of the optical amplifier layer, respectively.

7. The light emitting diode according to claim 1, wherein the reflective composite layer is provided with a mirror structure and uses an insulating material; or, the reflective composite layer comprises a second insulating layer and a second mirror layer disposed in stack.

8. The light emitting diode according to claim 1, wherein the first electrode and the second electrode are the anode and cathode of the reflective light-emitting layer, respectively, and the third electrode and the fourth electrode are the cathode and anode of the saturable absorber layer, respectively.

9. A light source apparatus, wherein the light source apparatus comprises a light emitting diode, wherein the light emitting diode comprises:

a substrate;

a reflective light-emitting layer disposed on the substrate;

a first electrode, a second electrode, and a first insulating layer, wherein the first electrode, the second electrode, and the first insulating layer are separately disposed on the reflective light-emitting layer;

a saturable absorber layer, wherein the saturable absorber layer is disposed on the first insulating layer; and a third electrode, a fourth electrode, and a reflective composite layer, wherein the third electrode, the fourth electrode, and the reflective composite layer are separately disposed on the saturable absorber layer, and a reflectivity of the reflective light-emitting layer is greater than the reflectivity of the reflective composite layer;

wherein the orthographic projections of the saturable absorber layer, the third electrode, the fourth electrode, and the reflective composite layer on the reflective light-emitting layer do not overlap with the first electrode and the second electrode, wherein the light emitting diode further comprises:

an optical amplifier layer, wherein the optical amplifier layer is disposed on the reflective composite layer; and a fifth electrode and a sixth electrode, wherein the fifth electrode and the sixth electrode are disposed on the optical amplifier layer separately;

wherein the orthographic projections of the optical amplifier layer, the fifth electrode, and the sixth electrode on the reflective light-emitting layer do not overlap with the first electrode and the second electrode; the orthographic projections of the optical amplifier layer, the fifth electrode, and the sixth electrode on the saturable absorber layer do not overlap with the third electrode and the fourth electrode.

10. An electronic device, wherein the electronic device comprises the light source apparatus according to claim 9.

11. The light source apparatus according to claim 9, wherein the saturable absorber layer comprises:

a first P-type semiconductor layer, wherein the first P-type semiconductor layer is disposed on the first insulating layer, and the third electrode is disposed on the first P-type semiconductor layer;

a first quantum well layer, wherein the first quantum well layer is disposed on the first P-type semiconductor layer, and the orthographic projection of the first quantum well layer on the first P-type semiconductor layer does not overlap with the third electrode; and a first N-type semiconductor layer, wherein the first N-type semiconductor layer is disposed on the first quantum well layer, the orthographic projection of the first N-type semiconductor layer on the first P-type semiconductor layer does not overlap with the third electrode, and the fourth electrode is disposed on the first N-type semiconductor layer.

12. The light source apparatus according to claim 9, wherein the reflective light-emitting layer comprises:

a P-type semiconductor reflective composite layer, wherein the P-type semiconductor reflective composite layer is disposed on the substrate, and the first electrode is disposed on the P-type semiconductor reflective composite layer;

a second quantum well layer, wherein the second quantum well layer is disposed on the P-type semiconductor reflective composite layer, and the orthographic projection of the second quantum well layer on the P-type semiconductor reflective composite layer does not overlap with the first electrode; and a second N-type semiconductor layer, wherein the second N-type semiconductor layer is disposed on the second quantum well layer, the orthographic projection of the second N-type semiconductor layer on the P-type semiconductor reflective composite layer does not overlap with the first electrode, and the second electrode is disposed on the second N-type semiconductor layer.

13. The light source apparatus according to claim 12, wherein the P-type semiconductor reflective composite layer is provided with a mirror structure; or, the P-type semiconductor reflective composite layer comprises a second P-type semiconductor layer and a first mirror layer disposed in stack, the first mirror layer is disposed close to the substrate.

* * * * *